United States Patent [19]

Tomita

[11] Patent Number: 5,086,437
[45] Date of Patent: Feb. 4, 1992

[54] AGC DEVICE FOR PRODUCING A GAIN CONTROLLED AND D.C. OFFSET REMOVED SIGNAL

[75] Inventor: Hideho Tomita, Tokyo, Japan

[73] Assignee: NEC Corporation, Tokyo, Japan

[21] Appl. No.: 537,994

[22] Filed: Jun. 13, 1990

[30] Foreign Application Priority Data

Jun. 13, 1989 [JP] Japan .................................. 1-151652

[51] Int. Cl.$^5$ ............................................. H04L 27/06
[52] U.S. Cl. ........................................ 375/98; 455/234
[58] Field of Search ............................. 375/98, 76, 39;
328/173; 330/254, 129; 455/234, 245, 71;
329/347, 348, 350; 342/92

[56] References Cited

U.S. PATENT DOCUMENTS 3,009,058 11/1961 Bodez ..................................... 375/98
3,733,553 5/1973 Magnante et al. ..................... 375/98

Primary Examiner—Benedict V. Safourek
Assistant Examiner—Tesfalde Bocure
Attorney, Agent, or Firm—Foley & Lardner

[57] ABSTRACT

In an automatic gain control device which is connected to an output circuit (21, 22) supplied with a gain controlled signal to produce a timing signal in a receiver of a direct conversion type and which includes an amplifier (23, 24) for amplifying a received baseband signal into an amplified signal with a controllable gain, a d.c. blocking circuit (25, 26) for producing a variable level signal with the amplified signal exempted from a d.c. component, and a level detector (27, 28) for producing a level value signal by detecting level values of the variable level signal, a timing controller (31) is supplied with the timing signal to produce a first control signal in each of predetermined time slots in which a receiver input signal comprises bursts representative of an information signal. A second control signal is produced in an interval between two consecutive ones of the predetermined time slots. Controlled by the first control signal, a sample holding circuit (35, 36) supplies the level value signal to the amplifier to control the gain. Controlled by the second control signal, a clamping switch (33, 34) produces the gain controlled signal by removing a d.c. offset from the variable level signal. The receiver input signal may be orthogonally modulated.

2 Claims, 2 Drawing Sheets

AGC DEVICE FOR PRODUCING A GAIN CONTROLLED AND D.C. OFFSET REMOVED SIGNAL

BACKGROUND OF THE INVENTION

This invention relates to an automatic gain control (AGC) device for use in a direct conversion receiver for receiving a receiver input signal which comprises bursts in predetermined time slots.

In a radio communication network which may be a mobile communication network, a communication device comprises the receiver and a transmitter. A finite succession of time slots is used in transmitting a radio signal with one time slot of the succession selected from a predetermined number of time slots of each frame. The predetermined time slots are the time slots selected for the receiver input signal. In response to an information signal carried by the receiver input signal, the transmitter sends in general a response signal carried by a transmitter output signal which comprises bursts in particular time slots with each particular time slot selected in each frame from idle ones of the predetermined number of time slots.

Such a receiver comprises a receiving circuit for receiving the receiver input signal to produce a received baseband signal. Being used in the radio communication network, the receiver input signal is inevitably subjected to fading to reach the receiver with an input level which may vary as wide as some tens of decibels. The automatic gain control device is therefore supplied with the received baseband signal to produce a gain controlled signal having a controlled level which should be kept substantially constant.

In the receiver, an output circuit is supplied with the gain controlled signal to produce a receiver output signal representative of the information signal. In the case of FSK signal demodulation the output circuit comprises a frequency detector for frequency demodulating the gain controlled signal into a digital baseband signal and for producing a timing signal which indicates the time slots in each frame and the predetermined time slots. A digital data detector is supplied with the digital baseband signal and produces the receiver output signal.

In the automatic gain control device, an amplifier circuit is used in amplifying the received baseband signal into an amplified signal and a gain controlled by a gain control signal. The amplified signal unavoidably has a direct-current (d.c.) component. An a.c. coupling circuit is used as a direct-current blocking circuit for blocking the direct-current component to produce a direct-current component blocked signal which has a variable level and may be called a variable level signal. A level detector circuit is for detecting the variable level to produce a level value signal representative of level values of the variable level.

In a conventional automatic gain control device, the level value signal is supplied to the amplifier circuit as the gain control signal. It should be noted in this connection that the variable level signal has a variable direct-current offset which gives rise to a distortion in the receiver output signal. This is because the direct-current offset adversely affects frequency demodulation operation carried out by the frequency detector. Furthermore, the direct-current offset renders gain control operation of the automatic gain control device unstable. This is because it is difficult for the level detector circuit to discriminate between the direct-current offset and the variable level. The direct-current offset becomes serious when the amplifier circuit amplifies the received baseband signal with a high gain and with a small amount of gain control.

In principle, the direct-current blocking circuit removes the direct-current offset. The direct-current blocking circuit has an a.c. coupling time constant. The automatic gain control device is operable with an automatic gain control time constant. Usually, the coupling time constant is selected longer than the automatic gain control time constant so that the direct-current blocking circuit may sufficiently attenuate a variation caused by the gain control operation in a direct-current level of the variable level signal and so that the direct-current offset may not adversely affect both the frequence demodulation and the gain control operations.

The receiver input signal may be modulating according to frequency shift keying (FSK) at a certain bit or data rate. In this event, the a.c. coupling time constant must be selected dependent on the bit rate so as not to deteriorate a bit error rate of the receiver output signal. On the other hand, the automatic gain control time constant must be selected so as to sufficiently follow the fading which may rapidly vary. If the automatic gain control time constant is short, it becomes impossible for the direct-current blocking circuit to sufficiently attenuate the variation in the direct-current level.

The frequency shift keying may be minimum shift keying (MSK). According to the minimum shift keying, the receiver input signal is modulated with a small degree of modulation index, such as only 0.5. Under these circumstances, the direct-current offset brings forth serious adverse effects to the frequency demodulation and the gain control operations.

SUMMARY OF THE INVENTION

It is therefore an object of the present invention to provide an automatic gain control device which is for use in a receiver for receiving a receiver input signal to produce a receiver output signal and which is capable of minimizing a distortion in the receiver output signal.

It is another object of this invention to provide an automatic gain control device of the type described, which is stably operable.

It is still another object of this invention to provide an automatic gain control device of the type described, for which the receiver input signal is a radio signal subjected to fading and which is rapidly operable to sufficiently follow the fading.

It is yet another object of this invention to provide an automatic gain control device of the type described, which is operable with a high stability and with a minimized distortion in the receiver output signal even when the receiver input signal is modulated with a small degree of modulation.

Other objects of this invention will become clear as the description proceeds.

In describing this invention, it is helpful to understand that an automatic gain control device is supplied with a received baseband signal to produce a gain controlled signal in a receiver comprising a receiving circuit for receiving a receiver input signal comprising bursts in predetermined time slots to produce the received baseband signal and an output circuit supplied with the gain controlled signal to produce a timing signal indicative of the predetermined time slots. The automatic gain control device includes an amplifier circuit for amplifying the received baseband signal into an amplified signal with a gain controlled by a gain control signal, a direct-current blocking circuit for blocking a direct-current component of the amplified signal to produce a variable level signal, and a level detector circuit for detecting level values of the variable level signal to produce a level value signal representative of the level values.

According to this invention, the above-understood automatic gain control device is characterised by: a timing controller supplied with the timing signal for producing a first control signal during each of the predetermined time slots and a second control signal in an interval between two consecutive ones of the predetermined time slots; supply means controlled by the first control signal for supplying the level value signal to the amplifier circuit as the gain control signal; and removing means supplied with the variable level signal and controlled by the second control signal for removing a direct-current offset from the variable level signal to produce the gain controlled signal.

DESCRIPTION OF THE PREFERRED EMBODIMENT

Figure 1:
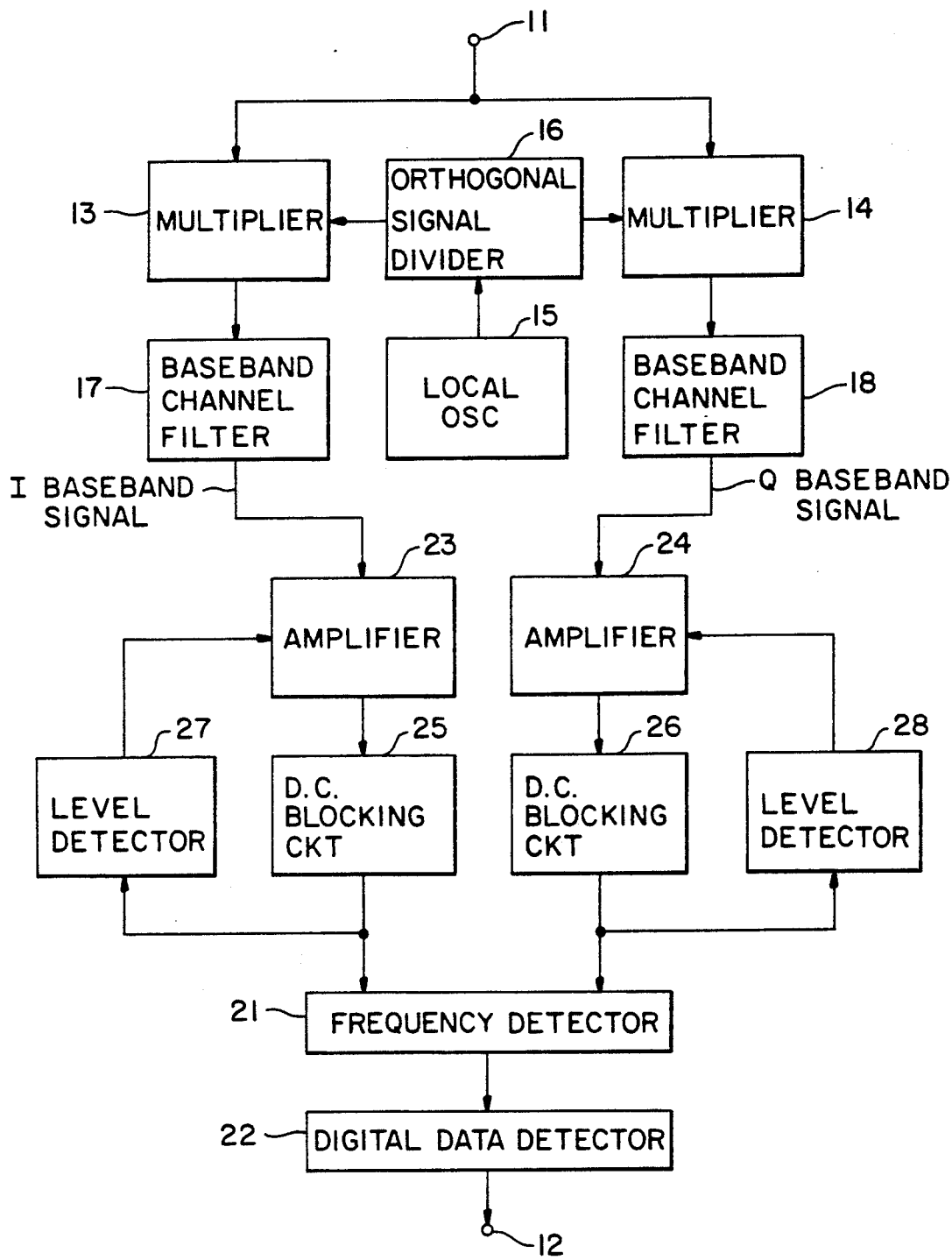
FIG. 1 is a block diagram of a receiver which comprises a conventional automatic gain control device.

Referring to FIG. 1, a conventional automatic gain control (AGC) device will be described at first in order to facilitate an understanding of the present invention. The automatic gain control device is included in a receiver which is of a direct conversion type and is for receiving a receiver input signal comprising bursts in predetermined time slots. It will be assumed that the receiver input signal is modulated by an information signal according to frequency shift keying (FSK).

In a radio communication network which may be a mobile communication network, a communication device comprises the receiver and a transmitter (not shown). A finite succession of time slots is used in transmitting a radio signal with one time slot of the succession selected from a predetermined number of time slots of each frame. When the communication device is for use in a digital voice communication network, each frame may be 20 milliseconds long. The predetermined number may be equal to eight. The predetermined time slots are the time slots selected for the receiver input signal. In response to the information signal, the transmitter sends in general a response signal carried by a transmitter output signal which comprises bursts in particular time slots with each particular time slot selected in each frame from the idle slots of the predetermined number of time slots.

In FIG. 1, the receiver has receiver input and output terminals 11 and 12. The receiver input terminal 11 is supplied with the receiver input signal. A receiving circuit comprises inphase (I) and quadrature phase (Q) multipliers 13 and 14 connected to the receiver input terminal 11. A local oscillator 15 generates a local oscillation signal for use in converting the receiver input signal to received baseband signals. An orthogonal signal divider 16 is supplied with the local oscillation signal and produces inphase and quadrature phase local oscillation signals. Supplied with the receiver input signal and the inphase local oscillation signal, the inphase multiplier 13 produces an inphase baseband signal. Responsive to the receiver input signal and the quadrature phase local oscillation signal, the quadrature phase multiplier 14 produces a quadrature phase baseband signal. In order to prevent crosstalk from occurring from adjacent frequency channels, inphase and quadrature phase baseband channel filters 17 and 18 are used to band-limit the inphase and the quadrature phase baseband signals. In this manner, the receiving circuit orthogonally demodulates the receiver input signal into inphase and quadrature phase received baseband signal components of the received baseband signal.

Being used in the radio communication network, the receiver input signal is unavoidably subjected to fading to reach the receiver input terminal 11 with an input level which may vary as wide as some tens of decibels. The automatic gain control device is therefore supplied with the received baseband signal to produce a gain controlled signal comprising inphase and quadrature phase gain controlled signal components. The automatic gain control device is for making each of the inphase and the quadrature phase gain controlled signal components have a controlled level which is kept substantially constant.

An output circuit comprises a frequency detector 21 supplied with the inphase and the quadrature phase gain controlled signal components to produce a digital baseband signal by carrying out frequency demodulation of the gain controlled signal. In order to carry out the frequency demodulation, a timing signal is used, which indicates the time slots in each frame and the predetermined time slots. Supplied with the digital baseband signal, a digital data detector 22 delivers a receiver output signal to the receiver output terminal 12. The receiver output signal is a data signal representative of the information signal and is accompanied by a clock signal. In this manner, the output circuit is supplied with the received baseband signal to produce the receiver output signal and the timing signal.

In FIG. 1, the automatic gain control device comprises an amplifier circuit comprising inphase and quadrature phase amplifiers 23 and 24 supplied with the inphase and the quadrature phase received baseband signal components. With a first gain controlled by a first gain control signal which will presently be described, the inphase amplifier 23 amplifies the inphase received baseband signal component into an inphase amplified signal component. With a second gain when is controlled by a second gain control signal independently of the first gain, the quadrature phase amplifier 24 amplifies the quadrature phase received baseband signal component into a quadrature phase amplified signal component. It is therefore possible to understand that the amplifier circuit (23 and 24) is supplied with the received baseband signal and produces the inphase and the quadrature phase amplified signal components collectively as an amplified signal with a gain which is controlled by a gain control signal comprising the first and the second gain control signals.

A direct-current (d.c.) blocking circuit comprises inphase and quadrature phase a.c. coupling circuits or capacitors as inphase and quadrature phase direct-current blocking circuit sections 25 and 26. The inphase direct-current blocking circuit section 25 is for blocking an inphase direct-current component of the inphase amplified signal component to produce an inphase direct-current component blocked signal. The quadrature phase direct-current blocking circuit section 26 is for blocking a quadrature phase direct-current component of the quadrature phase amplified signal component to produce a quadrature phase direct-current component blocked signal.

Even though band-limited, each of the inphase and the quadrature phase direct-current component blocked signals may include a different information signal which should be received by a similar receiver included in a different communication device other than the communication device including the receiver being illustrated. It is therefore understood that the inphase and the quadrature phase direct-current component blocked signals are inphase and quadrature phase variable level signal components of what is herein called a variable level signal. The direct-current blocking circuit (25 and 26) blocks a direct-current component of the amplified signal to produce the variable level signal.

A level detector circuit comprises inphase and quadrature phase level detectors 27 and 28. The inphase level detector 27 is for detecting an inphase variable level of the inphase variable level signal component to produce an inphase level value signal component representative of inphase level values of the inphase variable level. The quadrature phase level detector 28 is for detecting quadrature level values of the quadrature phase variable level signal component to produce a quadrature phase level value signal component representative of the latter level values. The inphase and the quadrature phase level value signal components are herein referred to collectively as a level value signal. The level detector circuit (27 and 28) detects level values of the variable level signal to produce the level value signal. Each level value may be an average level value. Alternatively, each level value may be either a peak value or a like level value.

The inphase level value signal component is supplied to the inphase amplifier 23 as the first gain control signal. The quadrature phase level value signal component is supplied to the quadrature phase amplifier 24 as the second gain control signal. The amplifier circuit (23 and 24) is therefore supplied with the level value signal as the gain control signal.

It should be noted in connection with the above that the variable level signal has a variable direct-current offset which gives rise to a distortion of the receiver output signal. This is because the direct-current offset adversely affects the frequency demodulation carried out by the frequency detector 21. Furthermore, the direct-current offset renders gain control operation of the automatic gain control device unstable. This is because it is difficult for the level detector (27 and 28) to discriminate the variable level from the direct-current offset.

In principle, the direct-current offset is removed by the direct-current blocking circuit (25 and 26). The blocking circuit has an a.c. coupling time constant. On the other hand, the automatic gain control device has an automatic gain control time constant. It is usual to select the automatic gain control time constant shorter than the coupling time constant. This is done so that the blocking circuit may sufficiently attenuate a variation in a direct-current level of the variable level signal to thereby prevent the direct-current offset from adversely affecting the frequency demodulation and the automatic gain control operation.

The receiver input signal is modulated at a certain bit rate. The a.c. coupling time constant must be selected in consideration of the bit rate so as not to deteriorate a bit error rate of the receiver output signal. On the other hand, the automatic gain control time constant must be selected so as to sufficiently follow the fading which may rapidly vary. If the automatic gain control time constant is short, it becomes impossible for the direct-current blocking circuit (25 and 26) to sufficiently attenuate the variation. Incidentally, the output circuit (21 and 22) is out of the scope of this invention and is therefore not described in detail.

Figure 2:
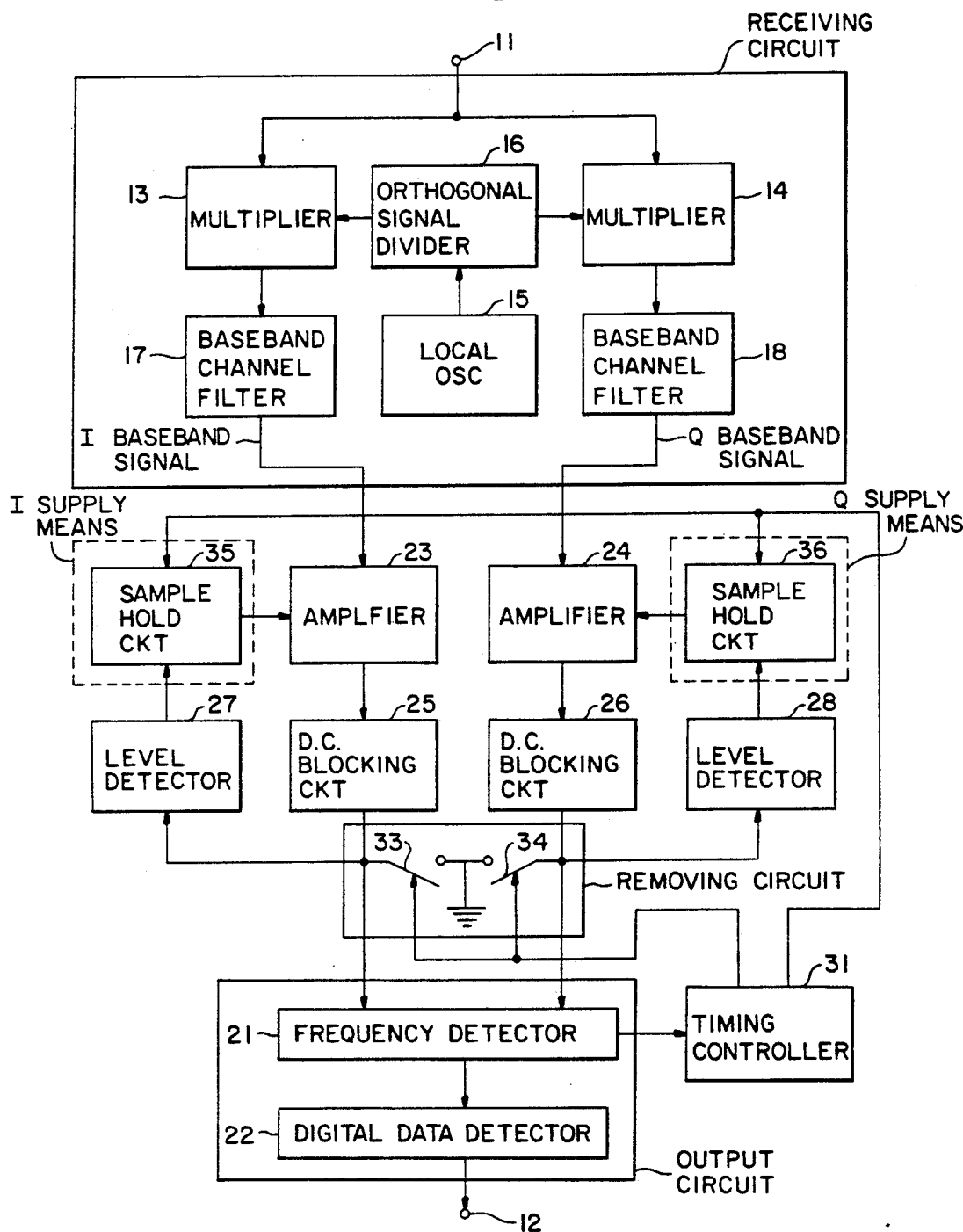
FIG. 2 is a block diagram of a receiver which comprises an automatic gain control device according to an embodiment of the instant invention.

Referring now to FIG. 2, a receiver is similar to that illustrated with reference to FIG. 1 and comprises an automatic gain control device according to a preferred embodiment of this invention. Similar parts are designated by like reference numerals and are operable with likewise named signals.

In FIG. 2, the automatic gain control device comprises a timing controller 31 supplied with the timing signal from the frequency detector 21. Such a timing controller is included in the receiver illustrated with reference to FIG. 1 for use in controlling the transmitter so as to make the transmitter send the transmitter output signal in the particular time slots. In marked contrast, the timing controller 31 is now used to produce a first control signal in each of the predetermined time slots and a second control signal in the interval between two consecutive predetermined time slots.

The automatic gain control device further comprises inphase and quadrature phase clamping switches 33 and 34 which are depicted as mechanically operable switches merely for convenience of illustration and are controlled by the second control signal. The inphase clamping switch 33 is for dynamically clamping the inphase variable level signal component to ground while supplied with the second control signal. Likewise, the quadrature phase clamping switch 34 is for dynamically clamping the quadrature phase variable level signal component to ground.

The inphase level detector 27 therefore detects the inphase level values of the inphase "variable" level signal component as inphase samples which are sampled only during the predetermined time slots. The quadrature phase level detector 28 detects the quadrature phase level values of the quadrature phase "variable" level signal component as quadrature phase samples only during the predetermined time slots. With either the average value or a similar level value scaled in the manner which will presently be described, the inphase level detector 27 produces a sequence of the inphase samples. The quadrature phase level detector 28 produces another sequence of the quadrature phase samples.

The automatic gain control device still further comprises inphase and quadrature phase sample holding circuits 35 and 36 which are for holding the inphase and the quadrature phase samples and are controlled in common by the first control signal. Timed by the first control signal, the inphase sample holding circuit 35 supplies the sequence of inphase samples to the inphase amplifier 23 as the first gain control signal. Activated by the first control signal, the quadrature phase sample holding circuit 36 supplies the sequence of quadrature phase samples to the quadrature phase amplifier 24 as the second gain control signal. The average or the similar level value should be scaled so as to make sure the sum of the information signal component and the noise in the inphase and the quadrature phase amplified signal components do not saturate the inphase and the quadrature phase amplifiers 23 and 24 in the respective predetermined time slots.

The sequence of inphase and quadrature phase samples serve collectively as the level value signal described before. It is now understood that a combination of the inphase and the quadrature phase sample holding circuits 35 and 36 serves as a supply arrangement supplied with the level value signal and controlled by the first control signal for supplying the level value signal to the amplifier circuit (23 and 24) as the gain control signal. Another combination of the inphase and the quadrature phase clamping switches 33 and 34 serves as a removing arrangement supplied with the variable level signal and controlled by the second control signal for removing the direct-current offset from the variable level signal to produce the gain controlled signal for supply to the frequency detector 21.

In describing the automatic gain control device being illustrated, the sequence of inphase and quadrature phase samples will be understood as the inphase and the quadrature phase level value signal components. The supply arrangement (35 and 36) is for supplying the inphase level value signal component to the amplifier circuit (23 and 24) as the first gain control signal and the quadrature phase level value signal component to the amplifier circuit (23 and 24) as the second gain control signal. The removing arrangement (33 and 34) removes the inphase direct-current offset from the inphase variable level signal component to supply the inphase gain controlled signal component to the frequency detector 21 and removes the quadrature phase direct-current offset from the quadrature phase variable level signal component to deliver the quadrature phase gain controlled signal component to the frequency detector 21.

Attention will now be directed to the fact that each of the predetermined time slots lasts from its beginning to its end. The first control signal has a leading edge at the beginning of each predetermined time slot. Each of the inphase and the quadrature phase samples will be referred to merely as a sample. Each predetermined time slot will be called a particular time slot when specifically taken into consideration.

Sampled in a particular time slot and subsequently held in the sample holding circuit 35 or 36, the sample is supplied to the amplifier circuit (23 and 24) in the next following predetermined time slot. The supply arrangement (35 and 36) should preferably be made by the leading edge of the first control signal produced during the particular time slot to supply the amplifier circuit (23 and 24) with the inphase and the quadrature phase level value signal components in the next following predetermined time slot.

Incidentally, the receiver is of the direct conversion type. The receiver is therefore readily manufactured according to the integrated circuit manufacturing techniques. This enables it possible to render the receiver compact and inexpensive.

While this invention has thus far been described in specific conjunction with only one embodiment thereof, it will now be readily possible for one skilled in the art to carry this invention into effect in various other manners. For example, the receiver input signal may not necessarily be orthogonally modulated but may be simply modulated.

What is claimed is:

1. An automatic gain control device supplied with a received baseband signal to produce a gain controlled signal in a receiver comprising a receiving circuit for receiving a receiver input signal comprising bursts in predetermined time slots to produce said received baseband signal and an output circuit supplied with said gain controlled signal to produce a timing signal indicative of said predetermined time slots, said automatic gain control device including an amplifier circuit for amplifying said received baseband signal into an amplified signal with a gain controlled by a gain control signal, a direct-current blocking circuit for blocking a direct-current component of said amplified signal to produce a variable level signal, and a level detector circuit for detecting level values of said variable level signal to produce a level value signal representative of said level values of said variable level signal, wherein the improvement comprises a timing controller supplied with said timing signal for producing a first control signal during each of said predetermined time slots and a second control signal in an interval between two consecutive ones of said predetermined time slots; supply means controlled by said first control signal for supplying said level value signal to said amplifier circuit as said gain control signal; and removing means supplied with said variable level signal and controlled by said second control signal for removing a direct-current offset from said variable level signal to produce said gain controlled signal for supply to said output circuit.

2. An automatic gain control device as claimed in claim 1, said receiver input signal being orthogonally modulated, said receiver circuit being for orthogonally demodulating said receiver input signal into inphase and quadrature phase received baseband signal components, said amplifier circuit being for amplifying said inphase received baseband signal component into an inphase amplified signal component with a first gain controlled by a first gain control signal and for amplifying said quadrature phase received baseband signal component into a quadrature phase amplified signal component with a second gain controlled by a second gain control signal, said direct-current blocking circuit being for blocking an inphase direct-current component of said inphase amplified signal component to produce an inphase variable level signal component and for blocking a quadrature phase direct-current component of said quadrature phase amplified signal component to produce a quadrature phase variable level signal component, said level detector circuit being for detecting inphase level values of said inphase variable level signal component to produce an inphase level value signal component representative of said inphase level values and for detecting quadrature phase level values of said quadrature phase variable level signal component to produce a quadrature phase level value signal component representative of said quadrature phase level values, said output circuit being supplied with inphase and quadrature phase gain controlled signal components of said gain controlled signal to produce said timing signal, wherein said supply means is for supplying said inphase level value signal component to said amplifier circuit as said first gain control signal and for supplying said quadrature phase level value signal component to said amplifier circuit as said second gain control signal, said removing means being supplied with said inphase variable level signal component for removing an inphase direct-current offset component from said inphase variable level signal component to produce said inphase gain controlled signal component and being supplied with said quadrature phase variable level signal component for removing a quadrature phase direct-current offset component from said quadrature phase variable level signal component to produce said quadrature phase gain controlled signal.

* * * * *